United States Patent
Bright

(10) Patent No.: US 8,838,192 B2
(45) Date of Patent: Sep. 16, 2014

(54) SUPERCONDUCTING SWITCH

(71) Applicant: Rolls-Royce PLC, London (GB)

(72) Inventor: Christopher G. Bright, Nottingham (GB)

(73) Assignee: Rolls-Royce PLC, London (GB)

( * ) Notice: Subject to any disclaimer, the term of this patent is extended or adjusted under 35 U.S.C. 154(b) by 139 days.

(21) Appl. No.: 13/622,716

(22) Filed: Sep. 19, 2012

(65) Prior Publication Data

US 2013/0085069 A1    Apr. 4, 2013

(30) Foreign Application Priority Data

Sep. 29, 2011  (GB) .................................. 1116753.3

(51) Int. Cl.
*H01L 39/00*   (2006.01)
*H01L 39/20*   (2006.01)
*H01L 39/24*   (2006.01)

(52) U.S. Cl.
CPC ............ *H01L 39/20* (2013.01); *H01L 39/2419* (2013.01)
USPC ................................................................ 505/150

(58) Field of Classification Search
CPC ............................. H01L 39/2419; C04B 35/45
See application file for complete search history.

(56) References Cited

U.S. PATENT DOCUMENTS

| | | | |
|---|---|---|---|
| 3,091,702 A * | 5/1963 | Slade ............................ | 327/370 |
| 3,200,299 A | 8/1965 | Autler | |
| 5,355,275 A * | 10/1994 | Goodier et al. ................ | 361/141 |
| 2007/0242406 A1* | 10/2007 | Annis et al. .................... | 361/147 |

FOREIGN PATENT DOCUMENTS

| | | |
|---|---|---|
| JP | A-64-50484 | 2/1989 |
| JP | A-01-157227 | 6/1989 |
| JP | A-1-177828 | 7/1989 |
| JP | A-01-206831 | 8/1989 |
| JP | A-11-113168 | 4/1999 |
| WO | WO 90/14715 A1 | 11/1990 |

OTHER PUBLICATIONS

Jan. 24, 2012 British Search Report issued in Application No. GB1 116753.3.
Partial European Search Report issued in European Patent Application No. EP 12 18 4948 on Feb. 6, 2014.

* cited by examiner

*Primary Examiner* — Colleen Dunn
(74) *Attorney, Agent, or Firm* — Oliff PLC

(57) ABSTRACT

This invention is a high voltage superconductor switch comprising: a length of superconductor having a switching portion located within an air gap; a magnetic circuit including at least one flux guide having ferrite pole pieces defining an air gap in which a switching portion of a superconductor can reside in use and at least one primary magnetic flux source located within the circuit so as to provide a quenching magnetic field across the air gap via the ferrite pole pieces.

14 Claims, 4 Drawing Sheets

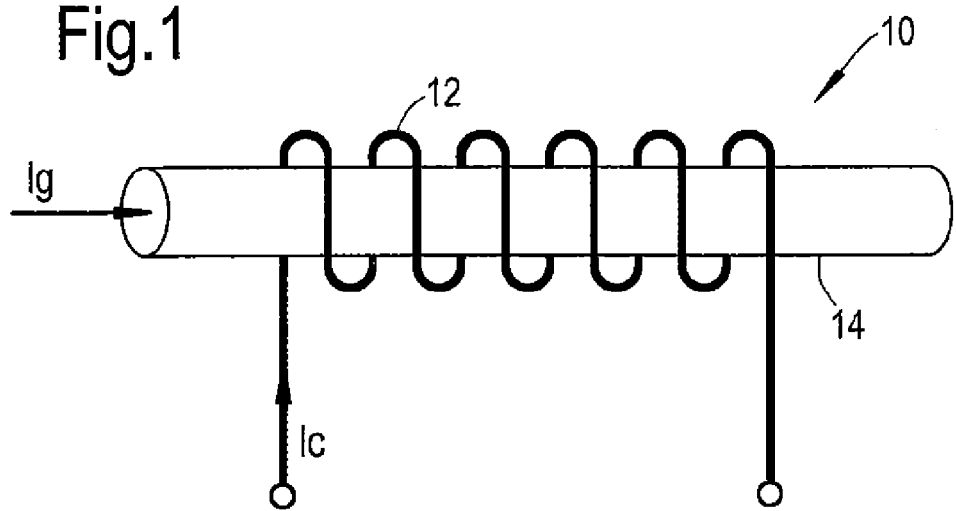
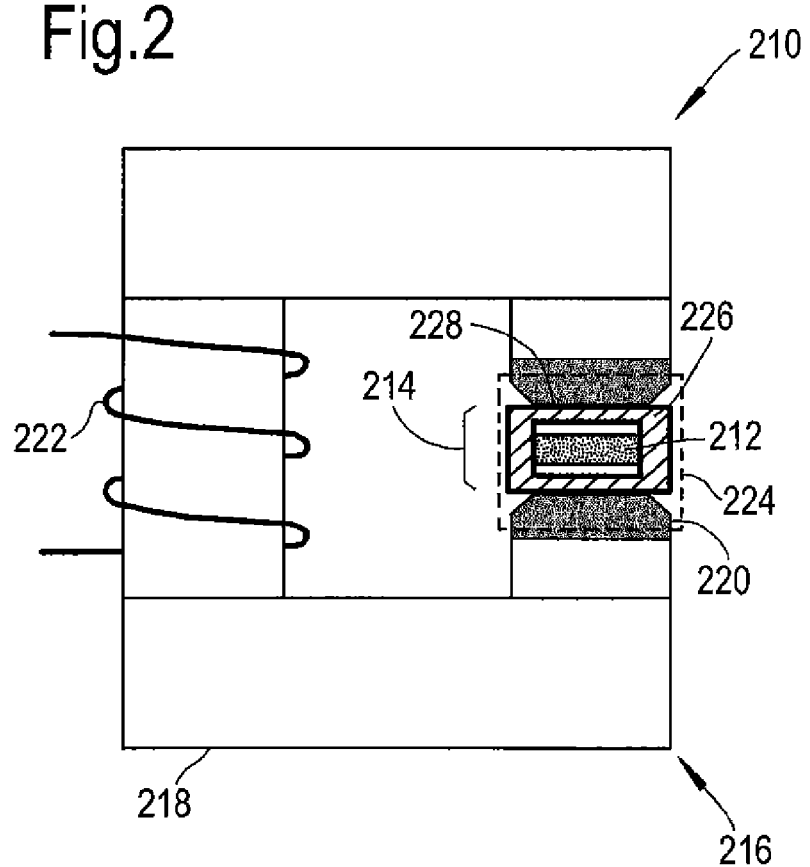

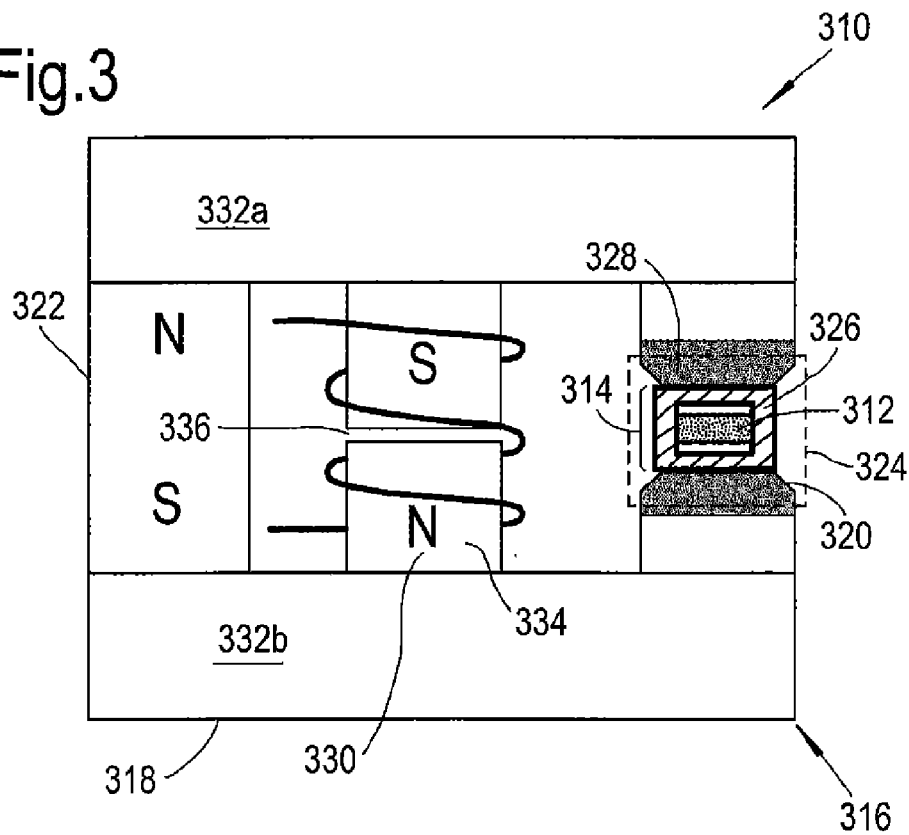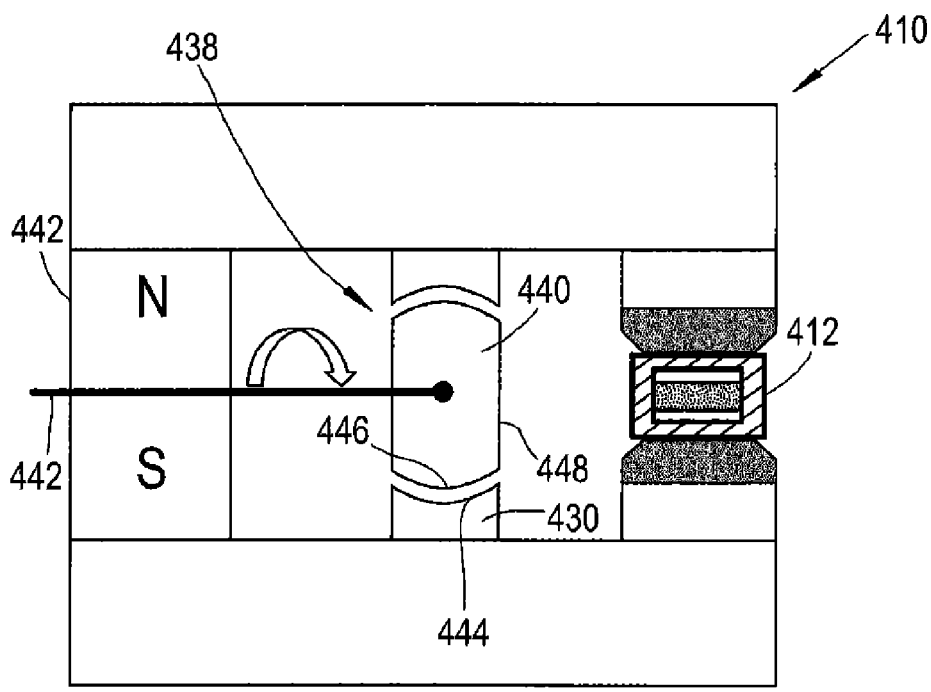

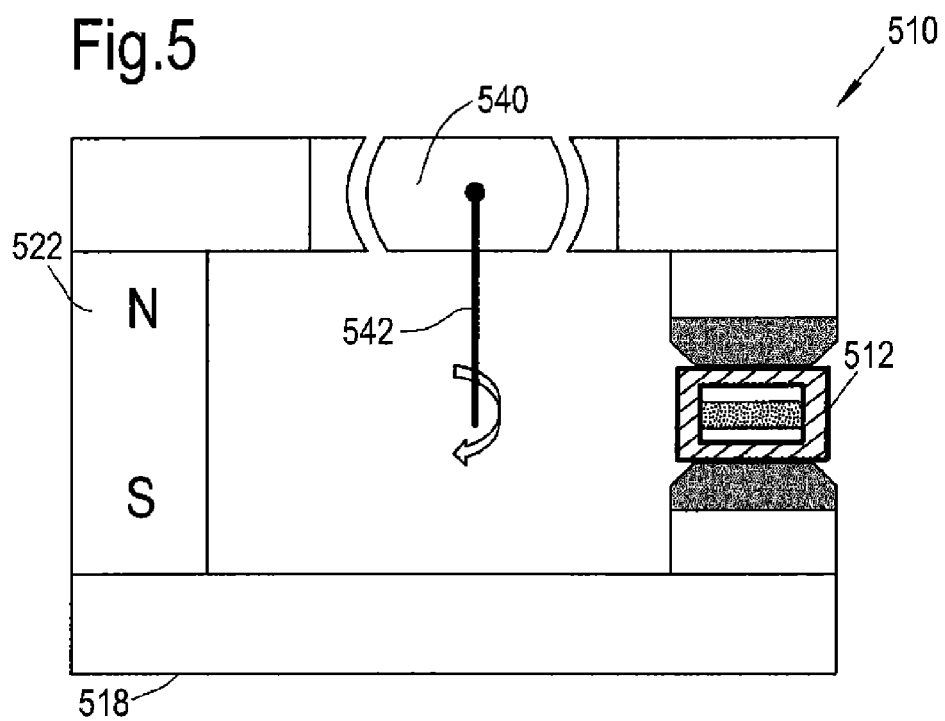
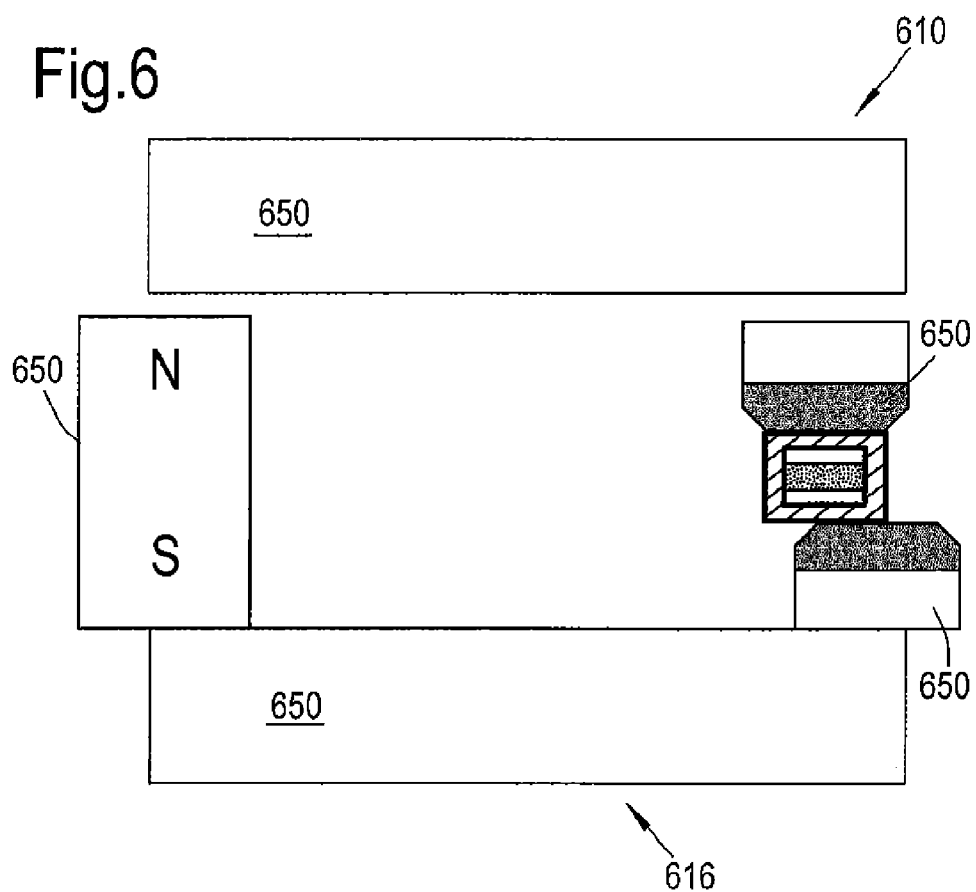

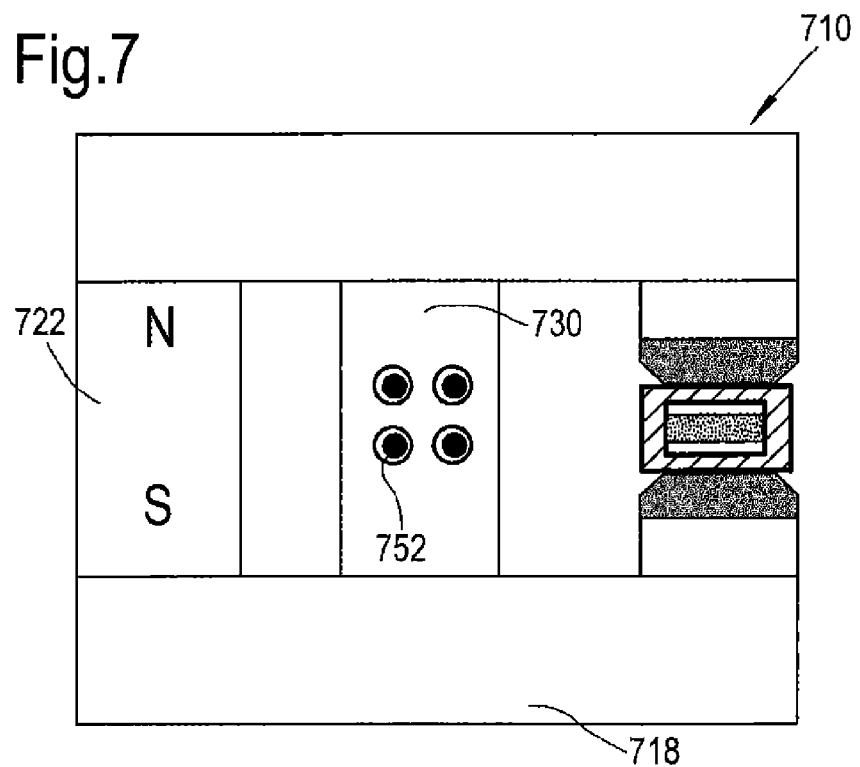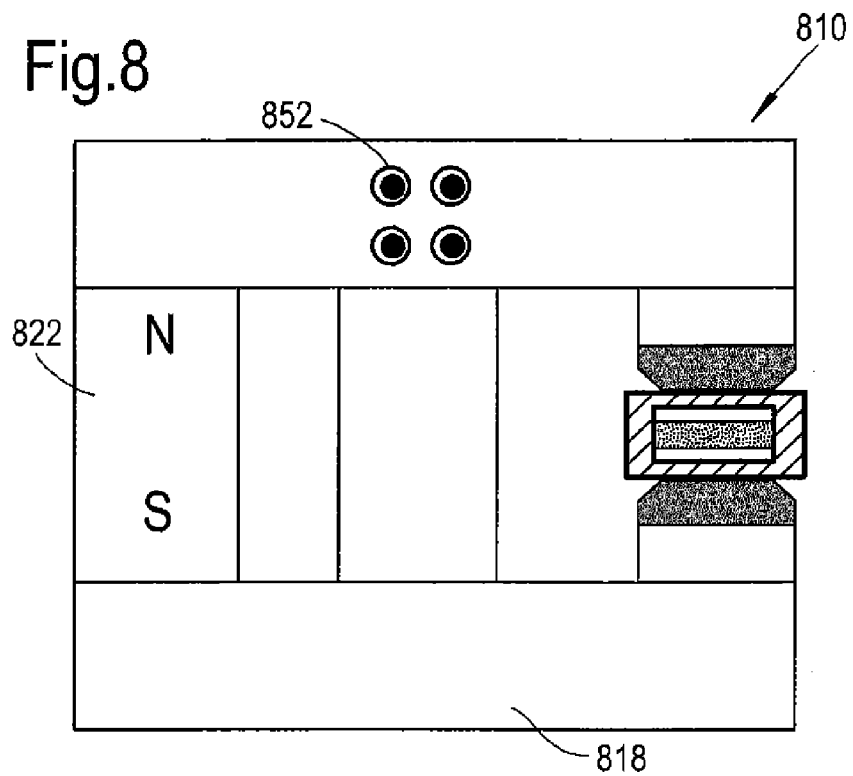

SUPERCONDUCTING SWITCH

TECHNICAL FIELD OF INVENTION

This invention relates to a superconducting switch. In some aspects, the superconducting switch is for use in a high voltage electrical system. In other aspects, the superconducting switch is used to provide an isolation switch. The isolating switch is particularly, though not exclusively, well suited to providing a failsafe isolation switch.

BACKGROUND OF INVENTION

Conventional state of the art propulsion systems for large civil aircraft typically include one or more gas turbine engines placed under the wings of the aircraft. However, some studies have indicated that so-called distributed propulsion, which involves having numerous smaller propulsion units preferentially arranged around an aircraft, may provide some significant benefits in terms of noise reduction and fuel efficiency when compared with the current state of the art technology.

One option for a distributed propulsion system is to have numerous electrically powered fan units located around the aircraft. However, early studies by the applicant have indicated that novel electrical technology will be required to implement such a distributed electrical system.

One such technology is the creation of a superconducting system to provide the electrical power to the fan units so as to try and reduce the weight of the electrical system.

The concept of using a superconductor for providing electrical power is well known. A superconductor conducts electricity without loss, that is, with zero electrical resistance. In order to be superconducting, current state of the art superconductor materials must be maintained below a critical temperature, current density and magnetic field. If any of the critical limits are exceeded then the superconductor is said to "quench", at which point it reverts to its "normal" electrical (and magnetic) properties.

For example, in the case of Yttrium Barium Copper Oxide, YBCO, the critical temperature is 93K; the upper critical magnetic flux density field is 120 T for a field perpendicular and 250 T for a field parallel to the copper oxide planes, and the critical current density is 30 GA $m^{-2}$. The so-called "supercurrent", that is the current that flows in the super conductor when in its superconducting state, flows in a very thin layer at the surface of the superconductor, typically 800 nm (the London Depth). However, the critical current density reduces with applied magnetic field and also will reduce as the temperature approaches the critical temperature.

In the case of ceramic superconductors the quenched electrical resistance can be very high. Hence, it is possible, and known, to provide a switch where an applied magnetic field is used to control the superconducting state of a superconductor and thus switch it between operating points having high and low (zero) resistance.

FIG. 1 shows the basic concept for a cryotron 10 which uses an electrical coil 12 wrapped around a length of superconductor 14. The superconductor current, Ig, flows until a direct current, Ic, of sufficient magnitude to produce a quenching magnetic field flows through the electrical coil 10. Once this occurs, the resistance increases until there is negligible current flow, thereby providing a switch.

The present invention seeks to provide a superconducting switch of general application but which may preferably be used in a distributed propulsion system of an aircraft.

STATEMENTS OF INVENTION

In a first aspect there is provided a high voltage superconductor switch comprising: a length of superconductor having a switching portion located within an air gap; a magnetic circuit including at least one flux guide having ferrite pole pieces defining an air gap in which a switching portion of a superconductor can reside in use and at least one primary magnetic flux source located within the circuit so as to provide a quenching magnetic field across the air gap via the ferrite pole pieces.

The magnetic circuit can include one or more ferromagnetic or ferrimagnetic portions. In one embodiment, substantially all of the magnetic flux guide is made from ferrite.

The superconductor can have a circular cross-section. The cross-section may be polygonal. The cross-section may be rectangular. The superconductor can be surrounded by electrical insulation taken from the non-exclusive group comprising ceramics or plastics or glass cloth. The superconductor can include thermal insulation taken from the non-exclusive group comprising ceramics or plastics or glass cloth.

The magnetic flux guide can include a U-shaped core or a C-shaped core.

For the purpose of the invention, high voltage is taken to mean a voltage above 1500V DC or 1000 V AC rms between electrical conductors or between one or more electrical conductors and Earth (ground).

The superconductor may be located within a cryostat having at least one wall. The ferrite pole pieces may pass through the at least one wall.

The magnetic flux source may be located outside cryostat. In another embodiment, the magnetic flux source may be located within the cryostat.

The magnetic flux guide may be an electromagnet.

The magnetic flux source may be a permanent magnet. The electromagnet may be selectively energised. The electromagnet may comprise a superconductor. The permanent magnet may be a superconductor. The permanent magnet may be magnetised by one of the known flux pumping techniques.

The high voltage superconductor switch may further comprise a selectively operable secondary magnetic flux source positioned to induce magnetic flux within the magnetic flux guide so as to disrupt or divert the magnetic flux generated by the primary magnetic source thereby reducing or removing the magnetic field produced across the air gap.

The selectively operable secondary magnetic flux source may be an electromagnet. The electromagnet may be coupled to a direct current electrical supply. The coupling to the direct current electrical supply may be via a switch. The electromagnet may include a superconductor. The electromagnet may be configured to provide a magnetic field within the magnetic flux guide which opposes and cancels the magnetic field produced by the primary magnetic flux source. The secondary magnetic flux source may be configured to saturate the magnetic material thereby increasing the magnetic reluctance of a portion of the magnetic circuit.

The secondary magnetic flux source may be in magnetic series with the primary magnetic flux source.

The magnetic flux guide may include a diverting flux guide path in parallel to the primary magnetic flux source.

The secondary magnetic flux source may be located along the diverting magnetic flux guide path.

The diverting magnetic flux guide path may include a diverting air gap.

The diverting air gap may have a larger reluctance than the air gap between the ferrite pole pieces. Thus, when the secondary magnetic flux source is not energised, a magnetic field is preferentially set up across the superconductor rather than the diverting air gap.

The secondary magnetic flux source may be arranged so as to saturate the magnetic flux guide when energised.

The magnetic flux guide may include a reluctance switch which is operable to increase the reluctance of at least a portion of the magnetic flux path.

The reluctance switch may include a mechanically removable portion of the magnetic circuit so as to increase the reluctance of the magnetic circuit beyond the reluctance of the air gap between the ferrite poles.

The mechanically removable portion may be connected to the magnetic circuit via a hinge, a slide or a two part coupling.

The reluctance switch may include a rotatable portion of the magnetic flux guide.

In a second aspect, the present invention provides a high voltage superconducting system comprising: the high voltage superconducting switch of the first aspect; a sensor for detecting the electrical condition of the superconductor; a switching system for operating the high voltage superconductor switch from a first, superconducting, state to a second, quenched, state.

The system may have a low electrical inertia. The system can be all or part of an isolated network. The isolated may have more than one electrical generator. The system may have less than ten electrical generators. The high voltage switch can be for the use of providing isolation within the system. The isolation may be for part of the system or a dedicated switch for a piece of electrical equipment. The system may be part of an electrical system in a vehicle, vessel or aircraft. The aircraft may include a distributed propulsion system. The distributed power system may include one or more electrically driven fan units located on and around the aircraft.

The electrical condition can include one from the group comprising a current or power flow or voltage above or below a predetermined amount and a loss of superconduction in the superconductor. The predetermined amount of current or power flow or the voltage can be based on an average or instantaneous rated value for the system or for a particular equipment. The skilled person will appreciate that other electrical characteristics may be used as the electrical condition.

The switching system may be operable to switch the reluctance switch or secondary magnetic flux source.

In a third aspect, the present invention provides a superconducting switch comprising: a length of superconductor having a switching portion located within an air gap; a magnetic circuit including: at least one flux guide having pole pieces defining the air gap in which the switching portion of the superconductor is located; at least one primary magnetic flux source located within the circuit so as to provide a quenching magnetic field across the air gap via the pole pieces; and, a selectively operable secondary magnetic flux source positioned to induce magnetic flux within the magnetic flux guide so as to disrupt or divert the magnetic flux generated by the primary magnetic source, thereby reducing or removing the magnetic field produced across the switching portion air gap in use.

In a fourth aspect, the present invention provides a superconducting switch comprising: a length of superconductor having a switching portion located within an air gap; a magnetic circuit including: at least one flux guide having pole pieces defining the air gap in which the switching portion of the superconductor is located; at least one primary magnetic flux source located within the circuit so as to provide a quenching magnetic field across the air gap via the pole pieces; and, a reluctance switch which increases the reluctance of at least a portion of the magnetic flux path, thereby reducing or removing the magnetic field produced across the switching portion air gap.

It will be appreciated that the various exemplary features relating to the ferrite pole pieces, secondary magnetic flux source and the reluctance switch described in relation to the first and second aspects are applicable to the third and fourth aspects.

DESCRIPTION OF THE DRAWINGS

Various embodiments of the invention are now described with the aid of the drawings in which:

FIG. 1 shows the aforementioned prior art system showing the general concept of a magnetically activated superconducting switch.

FIG. 2 shows a schematic cross section of a superconducting switch having ferrite pole pieces.

FIG. 3 shows a schematic cross section of a superconducting switch having a secondary magnetic flux source.

FIG. 4 shows a schematic cross section of a superconducting switch having a diversionary magnetic flux path which incorporates a reluctance switch.

FIG. 5 shows a schematic cross section of a superconducting switch having series reluctance switch.

FIG. 6 shows a schematic cross section of a superconducting switch having movable portions.

FIGS. 7 and 8 show schematic cross sections of a superconductive switch which includes saturation coils.

DETAILED DESCRIPTION OF INVENTION

FIG. 2 shows a high voltage superconductor switch 210. The switch includes a length of superconductor 212 having a switching portion located within an air gap 214, and a magnetic circuit generally shown by numeral 216. The switching portion is that defined as the length of superconductor 212 which experiences the quenching conditions when the switch 210 is operated.

The magnetic circuit 216 includes a magnetic flux guide 218 in the form of a ferromagnetic C-shaped core which has ferrite pole pieces 220 which define the air gap 214 in which a superconductor resides in use. The magnetic circuit 216 includes a magnetic flux source 222 in the form of an electromagnetic coil which is wound around a portion of the ferromagnetic core 218. The electromagnetic coil 222 and core 218 are such that a magnetic field sufficient to quench the superconductor 212 is placed across the air gap 214 via the ferrite pole pieces 220 when the coil 222 is energised with its rated current.

The superconductor is high voltage in that it is part of a network which operates at a voltage in excess of 1000 Vrms or 1500V DC. Hence, although not shown, the superconductor forms part of a larger electrical system. Although the invention has been conceived with aero applications in mind, specifically distributed propulsion, the system is not considered to be a limitation of the invention.

The superconductor 212 can be any suitable material such as Bismuth Strontium Calcium Copper Oxide (BSCCO), Yttrium Barium Copper Oxide (YBCO) or Magnesium Diboride (Mg2B). As is well known, in the case of YBCO, the critical temperature is 93K; the upper critical magnetic flux density field is 120 T for a field perpendicular and 250 T for a field parallel to the copper oxide planes, and the critical current density is 30 GA m$^{-2}$. The so-called "supercurrent", that is the current that flows in the super conductor when in its superconducting state, flows in a very thin layer at the surface of the superconductor, typically 800 nm (the London Depth). However, the critical current density will reduce with applied magnetic field and also will reduce as the temperature approaches the critical temperature.

In order for the superconductors to be in a superconducting state they must be cooled at or preferably below the critical temperature of the respective material. Hence, the superconductor 212 shown in FIG. 1 includes a cryostat as indicated schematically by the dashed line 224 and is surrounded by electrical and thermal insulation 226 as required. Typical materials for the electrical insulation and thermal insulation are ceramics or plastics or glass cloth. These materials have both the required electrical insulating properties and the required thermal properties.

The use of ferrite pole pieces 220 is particularly advantageous for application to a high voltage superconductive switch for numerous reasons. The first of these is that material is a ceramic and thus has a high dielectric strength which provides a high degree of electrical insulation for the superconductor 212. Further, ferrites generally have a lower thermal conductivity than their ferromagnetic counterparts. Thus, as shown in FIG. 1, the ferrite pole pieces 220 can extend through a wall of the cryostat 224 whilst minimising the thermal conduction and consequential leakage of heat into the cryostat 224. This allows for a more efficient design of switch 210. Further, ferrites can be of a lower density than many ferromagnetic materials which is preferable for aero applications which is a considered application of this technology.

The ferrite pole pieces 220 can, for example, be taken from the groups comprising iron oxide, manganese zinc or nickel zinc ferrites as known in the art.

It will be appreciated that, although the embodiment described in relation to FIG. 2 has only portions of the ferrite poles 220 and superconductor 212 located within the cryostat 224, it is possible to place the whole of the switch 210 within the cryostat 224 should this be considered a preferable option. Also, although the magnetic flux guide 218 is shown as having only ferrite pole pieces 220, it is possible for any part, or even the entirety of the magnetic flux guide 218, to be made from ferrite.

The ferrite pole pieces 220 taper along their length from junction with the body of the magnetic flux guide 218 to the pole faces 228 so as to reduce the pole face area and maximise the magnetic flux density within the air gap 214. This allows a concentration of the magnetic field within the air gap to aid the quenching of the superconductor 212 in the switching portion and also reduces the likelihood of an electrical discharge between the high voltage superconductor 212 and magnetic flux guide 214. The latter advantage meaning that the electrical insulation 226 around the superconductor 212 can be reduced and the pole pieces 220 placed closer to the superconductor 212, thereby reducing the energy required to set up the magnetic field.

An example of a working system includes a stainless steel strip wire that is 6 mm thick with a 1 mm thick coating of superconductor YBCO on each side, with the coatings on each side connected in parallel. This forms a superconducting arrangement 212 approximately 8 mm thick. The reason that the superconductor is not made entirely of superconducting material is because supercurrents flow in a very small layer at the surfaces of the superconductor. This layer is known as the London depth and is very shallow, typically 120 to 800 nm depending on the orientation of the supercurrent with respect to the crystal lattice.

The superconductor is cooled to an operating temperature of 75K and carries a full load current of 600 A with no applied magnetic field. The magnetic field produced by the current, 0.03 T, may be neglected when considering quenching. The operating temperature, 75K is well below the critical temperature of 93 K and is also below the boiling point of nitrogen, 77K and so liquid nitrogen may be used as a coolant.

An applied magnetic field of 0.25 T reduces the critical current density to 800 MA m$^{-2}$ reducing the critical current of the conductor to 16 A, well below the 600 A full load current. The superconductor would quench, that is, change to a high resistance state if it were carrying more than 16 A.

The ferrite pole pieces 220 are arranged to taper from 24×24 mm to 12×12 mm so that the flux density in the pole pieces falls from 0.25 T to 0.0625 T. The gap between the ferrite pole pieces 222 is 12 mm which equals the sum of the thicknesses of the steel (6 mm), the superconducting coatings (1 mm each) and the electrical and thermal insulation (2 mm each side of the steel) of the superconductor 212, 8 mm and 2 mm thick electrical insulation.

The magnetic circuit 216 is not worked close to magnetic saturation and so most of the magneto motive force produced by the electromagnetic coil 222 appear across the gap between the ferrite pole-pieces 220 and in particular the high reluctance paths presented by the electrical and thermal insulation (2 mm each side of the steel) and the superconducting coatings (1 mm each side). The magneto motive force across the 12 mm gap will therefore be developed across the 6 mm high reluctance path presented by the superconducting coatings and the electrical and thermal insulation between the ferrite pole-pieces 220. The magneto-motive-force required to produce a flux density of 0.25 T across the 6 mm high reluctance path is 1194 Am$^{-1}$. Hence, having an electromagnetic coil which can produce 2000 A turns allows for some magneto motive force to be used to magnetise the magnetic flux guide and the pole pieces and also to allow for leakage flux.

A possible rating of wire used for the electromagnetic coil of the magnetic flux generator 222 would be 1 A, and so the coil would have 2000 turns of such wire, each carrying 1 A. The coil would typically require 12 V DC to circulate 1 A DC.

In the above embodiment, DC excitation is preferred because the magnetic flux guide 218 and the ferrite pole-pieces 220 can be made from solid materials instead of laminated materials, simplifying construction. However, in another embodiment, laminated construction would result in a faster operating time of the switch because there would be less opposition from eddy currents to changes in magnetic fields. Also laminated construction would allow AC to be used which may be advantageous if AC were more easily provided than DC.

The magnetic flux guide has a cross sectional area of 24×24 mm. The limb carrying the electromagnetic coil would be typically 50 mm long and the limbs connecting the ferrite pole pieces 220 would typically be 80 mm long.

FIG. 3 shows a superconducting switch 310 having a magnetic circuit 316 and superconductor 312 as described for the embodiment shown in FIG. 2 and having corresponding numerals (3XX) for each of the constituent parts. However, the primary the magnetic flux source in this embodiment is a permanent magnet 322.

An additional magnetic flux path 330 is provided as part of the magnetic circuit 316 in this embodiment. The additional magnetic flux path 330 extends between the arms 332a, 332b of the C-shaped core 318 so as to be parallel to, and provide a diversionary path for the magnetic flux created by, the permanent magnet 322. The diversionary path 330 includes a secondary magnetic flux source in the form of an electromagnetic coil 334 which is configured to be selectively energised via a power source (not shown). An air-gap 336 is also provided at the mid-point of the diversionary path 330.

In operation, the electromagnetic winding is energised with a direct current so as to set up a magnetic field which opposes that of the primary magnetic flux source 322. Hence, the flux path extends from the North pole, N, of the permanent magnet to the South pole, S, of the electromagnetic winding 334 with a corresponding relationship between the south and north poles of the permanent and electromagnets, respectively. When in this configuration, there is insufficient magnetic field placed across the air-gap 314 and so the superconductor 312 remains in a superconducting state.

When isolation is required, the direct current in the electromagnetic winding 334 is switched off and the magnetic field created by the permanent magnet is then placed across the superconductor 312 which has a lower reluctance than the diversionary path 330. As will be appreciated, the ratio of the air gaps 314 and 336 will be dependent on the geometry of the magnetic circuit 316 and the magnetic field required to quench the superconductor 312.

The embodiment of FIG. 3 is particularly advantageous as it allows a failsafe mechanism to be implemented for the switch 310. Hence, if the D.C. supply is removed from the electromagnetic winding 334, for example, if it fails for some reason, then the load supplied by the superconductor 312 is automatically isolated. In this way, the electromagnetic winding 334 on the diversionary path 330 can be configured to sense and detect an undesirable electrical condition. As will be appreciated by the skilled person, other sensors may be employed as part of a larger system and the sensors may monitor various different parameters such as a maximum or minimum predetermined current flow or the superconducting state of the system. These sensors could be used by a generic control system to remove the D.C. supply to the winding 334.

FIG. 4 shows another embodiment of a switch 410 in which the diversionary path 430 is provided with a mechanical reluctance switch 438. The reluctance switch 438 is in the form of a rotatable ferromagnetic member 440 which resides in series within the diversionary flux guide path 430 so as to provide the magnetic flux path with a rotatable portion or gate. The rotatable member 440 is centrally mounted on a lever arm 442 which is rotated about a rotational axis by an acutator (not shown). The actuator is configured to move the rotatable member 440 between a first, low reluctance, position and a second, high reluctance, position.

The rotatable member 440 is substantially rectangular in shape having perpendicular major and minor axes, wherein the length of the rotatable member is substantially greater along the major axis relative to the minor axis. The faces 444 at the opposing ends of the major axis of the rotatable member 440 are curved with a radius having a centre which is coaxial with the rotational axis of the member as defined by the lever arm 442. The curved surfaces form uniform air gaps 446 with the corresponding faces of the diversionary path 430 when the major axis and longitudinal axis of the diversionary path 430 are aligned.

In the first position, the major axis is aligned with the longitudinal axis of the diversionary path body and the reluctance of the branch is at a minimum, thereby causing the majority of the flux to flow from the north pole of primary magnetic flux source, permanent magnet 422 to the south pole of the same via the diversionary path 430 and rotatable member 440.

To place the rotatable member 440 in the second position, the lever arm 442 is rotated through ninety degrees such that the minor axis of the rotatable member 440 is aligned with the longitudinal axis of the diversionary path 430. When in this configuration, the diversionary air gap 444 is formed by the curved surfaces of the diversionary path 430 and the flat sides 448 of the rotatable member 440. Thus, in the second position the air gaps 444 at either end of the rotatable member are increased relative to the first position and the reluctance of the diversionary path 430 is increased. Hence, in the second position the magnetic field created by the permanent magnet is set up across the air gap in which the superconductor 412 sits, thereby causing it to quench.

The operation of the lever arm 442 can be in response to any desired signal. So, for example, the actuator which drives the lever arm 442 could be activated in the event of a monitored electrical condition which falls outside of predetermined limits. If the lever arm is provided with a mechanical bias so as to be normally in the open position, the switch can be provided with a failsafe function as described in the previous embodiment.

In the alternative embodiment shown in FIG. 5, the switch 510 is provided with a rotatable member 540 in magnetic series with the primary magnetic flux source 522 and the diversionary path shown in FIG. 4 is no longer required. Thus, the rotatable member 540 can be thought of as being open when isolation of the current flow in the superconductor and is not required, with the minor axis been aligned to the longitudinal axis of the magnetic flux guide 518. When a separation is required, the rotatable member 540 is rotated through ninety degrees by the lever arm 542 such that the major axis of the rotating member 540 aligns with the longitudinal axis of the magnetic flux guide 518 thereby reducing the reluctance and greatly increasing the magnetic field across the air gap 514 in which the superconductor 512 sits.

In yet another embodiment, the magnetic circuit 616 of the switch is provided with moveable portions 650 as shown in FIG. 6. It be appreciated that the mechanism by which the moving portions 650 are provided can vary and include but are not limited to the hinges, slides and two-part fasteners; all of which can be operated using actuators.

Another option to provide magnetic isolation of the superconductor air gap is to saturate the magnetic material in a portion of the magnetic circuit. Thus, FIGS. 7 and 8 show embodiments of the invention which include electrical coils 752, 852 or other means which introduce a perpendicular magnetic field into the magnetic flux guide 718, 818 in the diversionary path (FIG. 7), and in magnetic series with the primary magnetic flux source (FIG. 8).

Energising the saturation coils 752, 852 results in a decrease in the relative permeability of the material local to the coils 752, 852 which causes the flux generated by the primary magnetic flux source 722, 822 to be diverted away from or towards the superconductor air gap as required. As described in the previous embodiments, the operation of the saturating coils 752, 852 can be on demand and as a result of monitoring an electrical condition.

Although the invention is described above with specific embodiments, these are not intended to restrict the scope of the invention which is defined by the claims.

Hence, for example, although the embodiments described above relate generally to a high voltage superconductor switch, it will be appreciated that this can be incorporated within a larger system. That system may be any electrical system which utilises superconductors.

In one embodiment, the system may be included in an electrical system of a vehicle, vessel or aircraft. The aircraft may include a distributed propulsion system. The distributed power system may include one or more electrically driven fan units located on and around the aircraft. For example, the system can be all or part of an isolated network. The isolated system may have more than one electrical generator. The system may have less than ten electrical generators. The high voltage switch can be for the use of providing isolation within the system. The isolation may be for part of the system or a dedicated switch for a piece of electrical equipment.

As will be appreciated, although the invention is well suited to high voltage applications, there are aspects of the invention which can be utilised in a system or network operating at any voltage. Thus, although the ferrite pole pieces are particularly advantageous to high voltage applications, this should not be seen as limiting. Further, it is possible for many aspects of the invention to be used without the ferrite pole pieces.

It will also be appreciated that combinations of features not specifically described above may be incorporated in a single device. For example, one embodiment may include both a reluctance switch and a secondary magnetic coil. Further, the superconductor may comprise magnetic stainless steel wire coated with superconducting material. This arrangement would improve the magnetic reluctance between the ferrite pole pieces.

The invention claimed is:

1. A high voltage superconductor switch, comprising:
a length of superconductor having a switching portion located within an air gap; and
a magnetic circuit, the magnetic circuit including:
at least one magnetic flux guide having ferrite pole pieces that define the air gap, and
at least one primary magnetic flux source located within the circuit, the at least one primary magnetic flux source being selectively configured so as to provide a quenching magnetic field across the air gap via the ferrite pole pieces, wherein
the switching portion of the semiconductor resides in the air gap in use; and
the superconductor is located within a cryostat having at least one wall, and the ferrite pole pieces pass through the at least one wall.

2. The high voltage superconductor switch of claim 1, wherein the switching portion of the superconductor has a length greater than 6 mm and less than 20 mm.

3. The high voltage superconductor switch of claim 1, wherein the at least one primary magnetic flux source is an electromagnet.

4. The high voltage superconductor switch of claim 1, further comprising a selectively operable secondary magnetic flux source positioned to induce magnetic flux within the at least one magnetic flux guide so as to disrupt or divert the magnetic flux generated by the at least one primary magnetic flux source, thereby reducing or removing the magnetic field produced across the air gap in use.

5. The high voltage superconductor switch of claim 4, wherein the secondary magnetic flux source is in magnetic series with the primary magnetic flux source.

6. The high voltage superconductor switch of claim 1, wherein the at least one magnetic flux guide includes a diverting magnetic flux guide path in parallel to the at least one primary magnetic flux source.

7. The high voltage superconductor switch of claim 6, further comprising a selectively operable secondary magnetic flux source positioned to induce magnetic flux within the at least one magnetic flux guide so as to disrupt or divert the magnetic flux generated by the at least one primary magnetic flux source, thereby reducing or removing the magnetic field produced across the air gap in use, wherein the secondary magnetic flux source is located along the diverting magnetic flux guide path.

8. The high voltage superconductor switch of claim 6, wherein the diverting magnetic flux guide path includes a diverting air gap.

9. The high voltage superconductor switch of claim 4, wherein the secondary magnetic flux source is arranged so as to saturate the at least one magnetic flux guide when energised.

10. The high voltage superconductor switch of claim 1, wherein the at least one magnetic flux guide includes a reluctance switch which is operable to increase the reluctance of at least a portion of the diverting magnetic flux guide path.

11. The high voltage superconductor switch of claim 10, wherein the reluctance switch includes a mechanically removable portion of the magnetic circuit so as to increase the reluctance of the magnetic circuit beyond the reluctance of the air gap between the ferrite poles.

12. The high voltage superconductor switch of claim 10, wherein the reluctance switch includes a rotatable portion of the at least one magnetic flux guide.

13. A superconducting switch comprising:
a length of superconductor having a switching portion located within an air gap; and
a magnetic circuit including:
at least one magnetic flux guide having pole pieces defining the air gap in which the switching portion of the superconductor is located;
at least one primary magnetic flux source located within the circuit so as to provide a quenching magnetic field across the air gap via the pole pieces; and
a selectively operable secondary magnetic flux source positioned to induce magnetic flux within the at least one magnetic flux guide so as to disrupt or divert the magnetic flux generated by the at least one primary magnetic flux source, thereby reducing or removing the magnetic field produced across the switching portion air gap in use, wherein
the superconductor is located within a cryostat having at least one wall, and the pole pieces pass through the at least one wall.

14. A superconducting switch comprising:
a length of superconductor having a switching portion located within an air gap; and
a magnetic circuit including:
at least one flux guide having pole pieces defining the air gap in which the switching portion of the superconductor is located;
at least one primary magnetic flux source located within the circuit so as to provide a quenching magnetic field across the air gap via the pole pieces; and
a reluctance switch that increases the reluctance of at least a portion of the magnetic flux path, thereby reducing or removing the magnetic field produced across the switching portion air gap, wherein
the superconductor is located within a cryostat having at least one wall, and the pole pieces pass through the at least one wall.

* * * * *